(12) United States Patent
Glinsner et al.

(10) Patent No.: US 9,960,058 B2
(45) Date of Patent: May 1, 2018

(54) DEVICE AND METHOD FOR TREATING SUBSTRATE SURFACES

(75) Inventors: Thomas Glinsner, St. Florian am Inn (AT); Ronald Holzleitner, Scharnstein (AT); Thomas Wieser, Kirchdorf am Inn (DE); Florian Schmid, Ried im Innkreis (AT)

(73) Assignee: EV GROUP E. THALLNER GMBH, St. Florian Am Inn (AT)

( * ) Notice: Subject to any disclaimer, the term of this patent is extended or adjusted under 35 U.S.C. 154(b) by 874 days.

(21) Appl. No.: 14/346,109

(22) PCT Filed: Sep. 22, 2011

(86) PCT No.: PCT/EP2011/066529
§ 371 (c)(1),
(2), (4) Date: Jul. 23, 2014

(87) PCT Pub. No.: WO2013/041144
PCT Pub. Date: Mar. 28, 2013

(65) Prior Publication Data
US 2014/0332036 A1    Nov. 13, 2014

(51) Int. Cl.
*H01L 21/67* (2006.01)
*H01L 21/02* (2006.01)
*H01L 21/687* (2006.01)

(52) U.S. Cl.
CPC .. *H01L 21/67057* (2013.01); *H01L 21/02052* (2013.01); *H01L 21/67051* (2013.01); *H01L 21/68714* (2013.01)

(58) Field of Classification Search
USPC ................................... 134/33, 157
See application file for complete search history.

(56) References Cited

U.S. PATENT DOCUMENTS

| | | | |
|---|---|---|---|
| 5,769,945 A | 6/1998 | Davis et al. | 118/52 |
| 5,916,366 A | 6/1999 | Ueyama et al. | 118/52 |
| 5,946,366 A | 8/1999 | Wistuba et al. | 376/280 |

(Continued)

FOREIGN PATENT DOCUMENTS

| | | | |
|---|---|---|---|
| CN | 1894779 A | 1/2007 | H01L 21/304 |
| CN | 101438383 A | 5/2009 | H01L 21/00 |

(Continued)

OTHER PUBLICATIONS

Preliminary Examination Opinion filed in corresponding International Application No. PCT/EP2011/066529, dated Sep. 9, 2011 (English-language translation included).
(Continued)

*Primary Examiner* — Katelyn B Whatley
(74) *Attorney, Agent, or Firm* — Kusner & Jaffe

(57) ABSTRACT

A device and method for treatment of a substrate treatment surface of a substrate with a fluid by immersion of the substrate treatment surface into the fluid. The device includes:
  receiving means for receiving the fluid with an immersion opening and immersion means for immersion of the substrate treatment surfaces through the immersion opening into the receiving means,
Rotation means are provided for rotation of the receiving means for at least predominant discharge of the fluid from the receiving means.

15 Claims, 2 Drawing Sheets

(56) References Cited

U.S. PATENT DOCUMENTS

| | | | |
|---|---|---|---|
| 7,416,611 B2 * | 8/2008 | Bergman | B08B 3/00 134/1 |
| 2004/0163682 A1 * | 8/2004 | Boyd | B08B 3/12 134/33 |
| 2004/0250839 A1 | 12/2004 | Robertson et al. | 134/33 |
| 2005/0115671 A1 * | 6/2005 | Araki | B08B 7/04 156/345.12 |
| 2009/0032188 A1 * | 2/2009 | Tsuchiya | H01L 21/67028 156/345.23 |
| 2009/0235952 A1 | 9/2009 | Lippert et al. | 134/1 |

FOREIGN PATENT DOCUMENTS

| | | | |
|---|---|---|---|
| EP | 1811552 | 7/2007 | H01L 21/304 |
| JP | H03-272140 A | 12/1991 | H01L 21/027 |
| JP | 10-209023 | 8/1998 | H01L 21/027 |
| JP | 2001-077069 A | 3/2001 | H01L 21/304 |
| JP | 2003-222631 A | 8/2003 | B08B 3/04 |
| JP | 2006-073753 A | 3/2006 | H01L 21/304 |
| TW | 200746285 | 12/2007 | H01L 21/304 |
| WO | WO 2006/051585 A1 | 5/2006 | H01L 21/304 |
| WO | WO 2007/128659 | 11/2007 | H01L 21/00 |

OTHER PUBLICATIONS

Office Action issued in corresponding Chinese Patent Application No. 201180073648.6, dated Nov. 3, 2015.

International Search for International Application PCT/EP2011/066529, dated Apr. 19, 2012.

\* cited by examiner

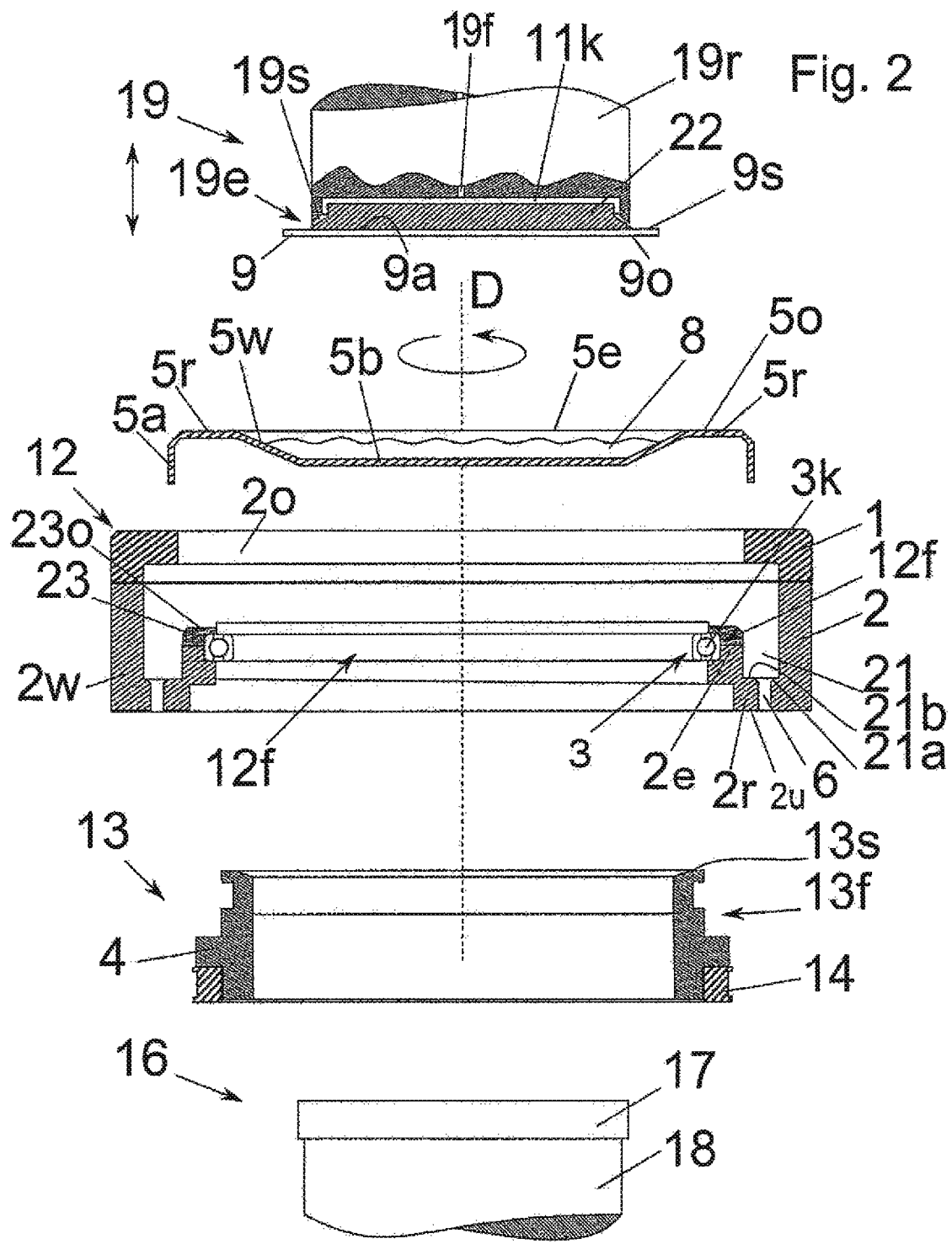

DEVICE AND METHOD FOR TREATING SUBSTRATE SURFACES

FIELD OF THE INVENTION

This invention relates to a device for treatment of a substrate treatment surface of a substrate, such as a wafer, with a fluid by immersion of the substrate treatment surface into the fluid, and a corresponding method.

BACKGROUND OF THE INVENTION

In the semiconductor industry, the cleaning of the wafer surfaces plays a major part. One type of cleaning of wafer surfaces is a wet chemical treatment which can also be used for stripping of polymers.

Generally the cleaning of the wafer surfaces takes place by means of liquids which are applied to the substrate surface, such as by liquid eddies, dripping, pouring, spraying, vapor deposition, etc. The substrate is often rotated, or at the end of the liquid application the substrate is rotated, to spin the liquid off the substrate.

There are often technical problems in that the wafers are becoming thinner and thinner, as a result of which damage can occur during rotation of the wafer and/or in the application of the liquid. The uniform application is also a major challenge. In this respect, it is desirable that the very expensive liquids used for treatment of the wafer surface are uniformly and efficiently applied to the entire wafer surface. Furthermore wasting of the liquid should be avoided.

Moreover it is desirable for the cleaning step to take place within a time interval which is as short as possible.

An advantage of this invention is a device which works as efficiently as possible, and a corresponding method, for treatment, i.e., cleaning, of a substrate treatment surface of a substrate, wherein uniform treatment with liquid consumption as low as possible can be ensured.

This advantage is achieved with the features of the claims. Advantageous developments of the invention are given in the dependent claims. All combinations of at least two of the features given in the specification, the claims and/or the figures also fall within the framework of the invention. At the given value ranges values which lie within the indicated boundaries will also be considered disclosed as boundary values and will be claimed in any combination. To the extent features disclosed for the device can also be understood as features of the method, they should also be considered disclosed according to the method and vice versa.

SUMMARY OF THE INVENTION

The idea of the invention is to treat a substrate treatment surface with a fluid such that the substrate or the substrate treatment surface is immersed into a liquid which is provided in a tank, during rotation of the substrate treatment surface. The rotation can also take place at intervals while the substrate treatment surface is immersed in the fluid. One feature of the invention is that the trough-shaped tank can be rotated so that after one or more treatments of substrate treatment surfaces, the fluid can be removed from the tank by rotation. Then the tank can be filled with a fresh fluid. Fluids can be liquids for wet chemical treatment. The configuration as claimed in the invention enables a very uniform application to the substrate treatment surface and during rotation of the immersion means, extremely efficient action of the fluid on the substrate treatment surface. Furthermore this invention ensures an optimum use of the fluid and a very simple replacement of the fluid. Moreover, during the treatment of the substrate treatment surface the minimum possible swirling or spraying of the fluid, especially none at all, takes place in the treatment space so that a very clean treatment is enabled.

Very thin wafers can also be attached to so-called film frames for fixing. As claimed in the invention, all types of wafers and mountings with which wafers are fixed, whether for stabilization and/or transport, are disclosed. Throughout the entire patent, the term "wafer" is used as a synonym for individual wafers or for wafers on these mountings.

According to one advantageous embodiment of the invention, the receiving means is made as a rotationally symmetrical trough, with one trough wall angled in the radial direction. The trough shape can be easily produced and can be easily rotated in a rotationally symmetrical configuration. An angled trough wall has the advantage that the discharge of the fluid is facilitated.

According to another advantageous embodiment, it is advantageous if the trough has a peripheral edge which is curved against the trough shape and which projects over the rotation means for discharging the fluid to an especially ring-shaped fluid collection tank. In this way the fluid is routed in a controlled manner in the direction of the fluid collection tank, by rotation of the trough and the resulting drainage of the fluid over the curved peripheral edge, the peripheral edge advantageously ending in the fluid collection tank. Thus it is moreover ensured that the fluid does not come into contact with other components besides the substrate treatment surface, the receiving means and the fluid collection tank. Furthermore it is advantageous if the fluid collection tank which is formed especially by a stator on its bottom, in at least one sunken region, preferably at the lowest point of the fluid collection tank, has at least one drain which is provided especially with a triggerable valve. Thus the fluid is routed on the shortest path from the receiving means to the fluid collection tank and can be withdrawn from there via drains which are provided over the bottom of the fluid collection tank and in the bottom and can be treated for re-use.

To the extent the receiving means, in the region of the peripheral edge, can be fixed on the rotation means which is made as preferably rotationally symmetrical hollow bodies, the receiving means is interchangeable, for example in wear/fouling or abrasion or for adaptation of the fluid receiving volume. Fixing exclusively in the region of the peripheral edge enables a material-saving execution and moreover access to the receiving means from underneath, especially for a heating means which is described below.

A stator which is made as a preferably rotationally symmetrical hollow body for holding the rotation means which can rotate in the stator enables a space-saving and material-protective configuration of the device, as claimed in the invention.

Here as claimed in the invention, it is advantageous if the device is made such that the rotation of the rotation means takes place along an especially ring-shaped guide segment which is located on the inner periphery of the stator, especially by means of a ball bearing between the guide segment and a corresponding guide segment of the rotation means. This arrangement leads to a stable configuration of the device so that a correspondingly high rotational speed and rapid discharge of the fluid from the receiving means are possible, as claimed in the invention.

According to another embodiment of the invention, there is provided heating means for temperature control of the fluid, especially in the form of a preferably rotatable heating body with a heating plate. The heating means can be located underneath the receiving means and/or within the rotation means. Via a corresponding control apparatus, the heating means can be moved into its operating position and accordingly the rotation of the heating means can be controlled. Rotation of the heating means as claimed in the invention causes homogenization of the temperature exposure along the receiving means. An equidistant arrangement of the heating plate or of the surface of the heating plate facing the receiving means also contributes to this. The position of the heating plate to the bottom of the trough-shaped (trough) receiving means can preferably be monitored and adjusted. The optimum distance between the bottom of the trough (receiving means) and the top of the heating plate is smaller than 1 cm, preferable smaller than 1 mm, more preferably smaller than 300 μm, most preferably smaller than 100 μm, most preferably of all smaller than 50 μm. The space between the heating plate and the trough can also be flushed with a gas which preferably has good heat convection properties in order to transport the heat optimally from the heating plate to the trough. The gas can be introduced either via nozzles (not shown) which project into the intermediate space or which are located in the heating plate. Since the heating plate can be pivotally mounted, the contact between the top of the heating plate and the bottom of the trough in a relative rotation of the two components should preferably be prevented. If relative rotation between the heating plate and trough does not take place, making contact of the surface of the heating plate with the bottom of the trough for faster heat transfer or for preheating is contemplated. It is also contemplated that for the shaft on which the heating plate sits is coupled, via a coupling (not shown), to the hollow shaft on which the trough lies and thus effects the centrifugal process which is described below by the rotation of the trough.

Instead of the heating plate, an ultrasonic head is also contemplated, which ultrasonic head travels in contact with the bottom of the trough and injects acoustic waves into the liquid of the trough in order, for example, to accelerate cleaning processes. A combination of ultrasonic head and heating plate is also contemplated. If the injection of the ultrasonic waves into the liquid should be possible without direct contact of the surface of the ultrasonic head with the bottom of the trough via the gas space, this is likewise to be disclosed here.

It is furthermore advantageous if the immersion means have rotatable fixing means for fixing the substrate on one receiving surface which faces away from the substrate treatment surface and by rotation of the substrate during treatment of the substrate treatment surface, therefore in a state immersed in the fluid, the treatment which is generally associated with a chemical reaction is clearly accelerated. The rotation can also take place at intervals. Furthermore the rotation of the fixing means as claimed in the invention can be used for centrifuging of fluid which is adhering to the substrate after treatment, therefore in one position above the fluid. To the extent the centrifuging takes place a short distance above the fluid surface, as little fluid as possible is wasted since most of the fluid drips or is centrifuged into the receiving means. To the extent fluid is centrifuged over the edge of the receiving means, it is automatically collected in the collection tank. The return of the fluid into the receiving means is further optimized by the rotational velocity being reduced, especially to zero, as the substrate is moved out of the fluid and only then is slowly increased.

According to another advantageous embodiment of the invention, the immersion means has flushing means for flushing of a flushing surface which remains outside the substrate treatment surface and outside the receiving surface, using a flushing fluid. This avoids the fluid for treatment of the substrate treatment surface acting on regions other than the substrate treatment surface on the substrate. The flushing fluid can be, for example, an inert gas so that mixing with the fluid for treatment of the substrate is avoided or prevented. The flushing fluid can also be liquids. It is decisive that during the cleaning process of the front of the wafer, the cleaning substance of the trough cannot wet the back of the wafer or can do so only in very small amounts.

In the method as claimed in the invention, according to one advantageous embodiment, the rotation means is rotated in a stator for holding the rotation means, the rotation of rotation means taking place along an especially ring-shaped guide segment which is located on the inner periphery of the stator, preferably by means of a ball bearing between the guide segment and a corresponding guide segment of the rotation means.

According to another aspect of the claimed method, the temperature of the fluid will be controlled by heating means for temperature control at least during the immersion of the substrate treatment surface.

To the extent at least during the immersion of the substrate treatment surface a flushing of a flushing surface which remains outside the substrate treatment surface and a receiving surface which faces away from the substrate treatment surface takes place, contamination or exposure of the substrate outside the substrate treatment surface is avoided or prevented.

According to the method, it is furthermore advantageously provided that the substrate treatment surface will be rotated by fixing means for holding the substrate at least during the immersion. In this way treatment is accelerated.

The construction as claimed in the invention also allows the changing of the chemicals in the trough between the use of different wafers and/or during the fixing of an individual wafer. Very often the surface of a wafer is to be treated in sequence with different chemicals. The wafer remains fixed in this method. The trough is filled especially sequentially with the individual chemicals. Before using a new chemical the old one is centrifuged out of the trough by the centrifuging process as claimed in the invention. It is also contemplated to use the trough as a mixing container for chemicals in order to obtain a corresponding new chemical. Between the use of different chemicals, the trough may be cleaned with a detergent. The detergent in this case is also considered a chemical, but is preferably not brought into contact with the wafer.

Other advantages, features and details of the invention will become apparent from the following description of preferred exemplary embodiments and using the drawings.

BRIEF DESCRIPTION OF THE DRAWINGS

FIG. 1 shows a schematic cross sectional view of one embodiment of the device as claimed in the invention and FIG. 2 shows an exploded depiction of the schematic view according to FIG. 1.

The same components or components with the same function are identified in the figures with the same reference numbers.

DETAILED DESCRIPTION OF THE PREFERRED EMBODIMENT

Figure 1:
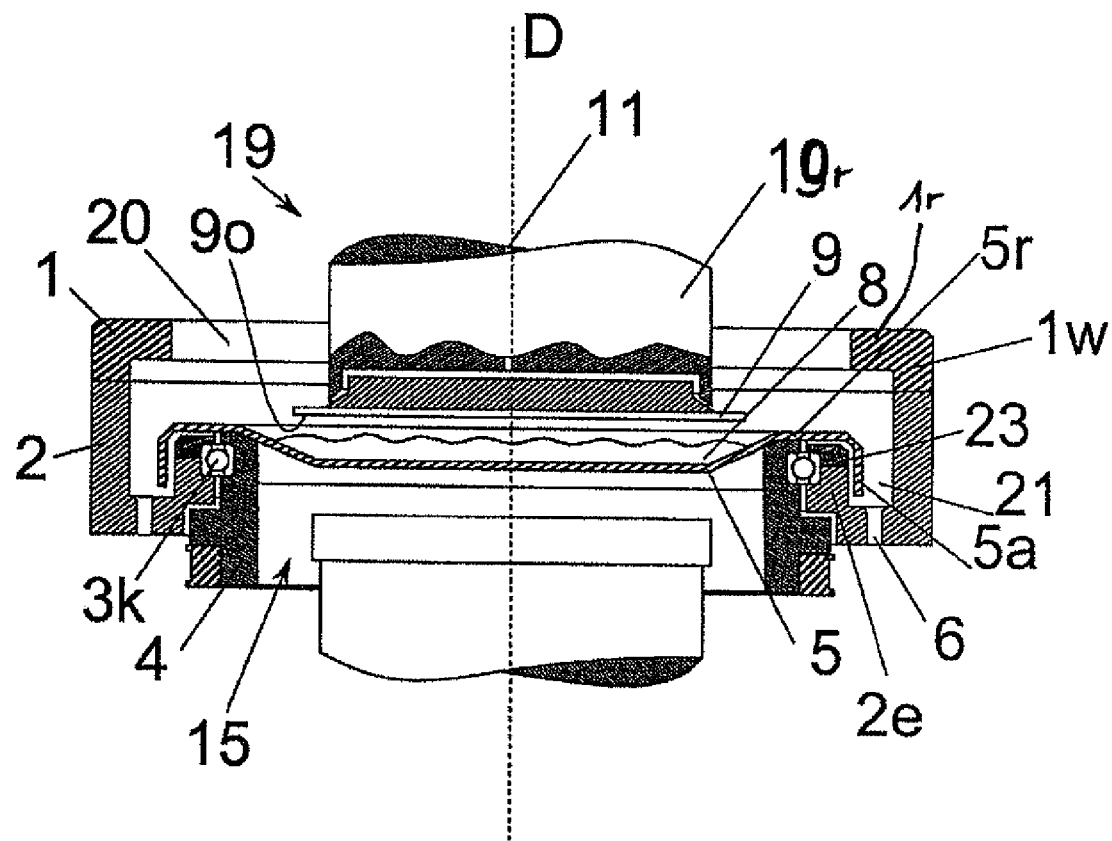

In the embodiment of the invention which is shown in FIGS. 1 and 2, the device is comprised of five main components, namely, a stator 12, a rotation means 13 which can be rotated relative to the stator 12 and a receiving means 5 which can be fixed on the rotation means 13. Furthermore, a heating means 16 can be extended and retracted in a heating space 15 which is formed by the rotation means 13 and the receiving means 5, along one axis D of rotation. Another important component is the immersion means 19 which is used for immersion of a substrate 9 which is held on fixing means 22 into a fluid 8 which is provided in the receiving means 5. For this purpose the immersion means 19 is made to be able to move along the axis D of rotation.

In this exemplary embodiment, the fixing means 22 is a component of the immersion means 19 and is attached by webs 19s on one immersion side 19e on a body 19r of revolution which can be rotated by a control apparatus. Between the body of revolution 19r and the fixing means 22 there is a flushing fluid channel 11k of flushing means 11 for feeding a flushing fluid from one flushing fluid line 19f which passes through the body of revolution 19r. The flushing fluid can be especially inert gas with which the substrate 9 can be exposed at least partially to flushing fluid.

The fixing means 22 is a chuck which is used especially via vacuum paths not shown for fixing and holding the substrate 9 on one receiving surface 9a. The vacuum paths can be connected to a vacuum apparatus analogously to the flushing fluid line 19f or through the webs 19s. The substrate 9 with the fixing means 22 is held in the conventional manner.

The stator 12 is comprised of a rotationally symmetrical bottom part 2 with a circular ring-shaped peripheral wall 2w. On one bottom 2u, proceeding from the peripheral wall 2w, a circular ring-shaped ring shoulder 2r extends radially to the inside. From the ring shoulder 2r a bearing ring 2e extends parallel to the peripheral wall 2w. To form a guide segment 12f as a component of a ball bearing 3 a bearing cover 23 which can be attached to the bearing ring 2e can be fixed on the bearing ring 2e.

A corresponding guide segment 13f of the ball bearing 3 is provided on the periphery of the rotation means 13 which is made as hollow body. The mounting of the rotation means 13 on the stator 12 takes place by alignment of the guide segments 12f and 13f, the bearing cover 23 being attached first on the bearing ring 2e when balls 3k of the ball bearing 3 are inserted into the latter. The ball bearing 3 is completed by fixing the bearing cover 23.

The rotation means 13 on one upper end side 13s projects over one top 23o of the bearing cover 23 so that the receiving means 5 which is resting on the end side 13s with one peripheral edge 5r is located at a distance to the bearing cover 23, although the peripheral edge 5r has a straight, radially running top edge 5o.

The peripheral edge 5r runs, i.e. extends, not only over the bearing cover 23, but also projects over the bearing ring 2e in a ring segment 5a which runs parallel to the axis D of rotation. The ring segment 5a runs with a distance to the bearing ring 2e and the bearing cover 23 and ends in a fluid collection tank 21. The fluid collection tank 21 is formed by the bearing ring 2e, the ring shoulder 2r and the peripheral wall 2w, one bottom 21b of the fluid collection tank 21 being formed by the ring shoulder 2r.

The rotation means 13 can thus be rotated by the ball bearing 3 relative to the fixed stator 12 by drive means 14 which are located on the rotation means 13 and which can be driven by a drive motor which is attached especially to the stator 12, which is not shown, and which is controlled by a control apparatus which is not shown.

The drive means 14 are provided on a hollow body 4 of the rotation means 13 on a lower segment, while the guide segment 13f is located on an upper segment of the hollow body 4. The receiving means 5 are made trough-shaped within the peripheral edge 5r, one trough wall 5w which adjoins the peripheral edge 5r running, not parallel to the axis D of rotation, but angled to the axis D of rotation at a trough wall angle W between 15 degrees and 75 degrees, especially between 30 degrees and 70 degrees, up to a trough bottom 5b. The trough wall 5w and the trough bottom 5b form a trough-shaped immersion opening 5e of the receiving means 5.

The receiving means 5 can be filled with the fluid 8 via a fluid line (not shown) and which can be moved freely, preferably controlled by the control apparatus. The receiving means 5 is dimensioned such that the substrate 9 can be immersed into the fluid 8 at least with one substrate treatment surface 9o which is located opposite the receiving surface 9a.

The receiving surface 9a is especially at least predominantly hidden by the fixing means 22 and is not exposed to fluid 8 there.

When the substrate 9 is immersed into the fluid 8, the flushing fluid is flushed by the flushing means 11 along a flushing surface 9s which is provided outside the receiving surface 9a and outside the substrate treatment surface 9o. The flushing surface extends annularly around the receiving surface 9a and the flushing with the flushing fluid leads to the flushing surface 9s (also) being exposed to the fluid 8 as little as possible.

As soon as the substrate treatment surface 9o is immersed into the fluid 8, the substrate 9 is rotated by rotation of the immersion means 19 so that the action of the fluid 8 is accelerated.

In addition, the action of the fluid 8 on the substrate treatment surface 9o can be accelerated by the heating means 16 being moved into the heating space 15 which is formed by the receiving means 5 and the rotation means 13 and activated. The heating means 16 comprise a heating plate 17 facing the trough bottom 5b and a heating body 18 which holds the heating plate and which is made to be able to rotate to render the heating action uniform.

As soon as the treatment of the substrate treatment surface 9o has been completed, the velocity of rotation of the immersion means 19 is reduced and the substrate 9 is drawn out of the fluid 8 into the position shown in FIG. 1. In this position the rotation of the substrate 9 is again accelerated so that any fluid 8 adhering to the substrate 9 first drips off and is then spun off. Most of the dripping or centrifuged fluid 8 will remain in the receiving means 5, while a fraction, preferably less than 10%, is spun away over the peripheral edge 5r and is captured in the fluid collection tank 21.

After at least one substrate 9, but preferably several substrates 9, have been treated accordingly, a replacement of the fluid 8 is necessary. To do this, with the immersion means 19 extended, the rotation means 13 is driven by the drive means 14. As a result, the fluid 8 is discharged into the fluid collection tank 21 over the peripheral edge 5r by means of the centrifugal force acting on the fluid 8 radially out of the axis D of rotation to the outside along the trough bottom 5b and the trough wall 5r.

On the bottom 21b or at its lowest point, especially in a sunken region 21a, on the periphery of the ring shoulder 2r there are several drains 6 arranged in a distributed manner, by which the fluid 8 can be withdrawn in a controlled manner, especially via a valve which can be triggered by the control apparatus, and can be supplied to treatment.

In order to capture the fluid 8 as completely as possible in the fluid collection tank 21, on the bottom part 2 there is a top part 1 which has a peripheral wall 1w which corresponds to the peripheral wall 2w and a ring shoulder 1r which is pointed radially to the inside. The top part 1 is configured such that fluid 8 which has been centrifuged to the outside out of the receiving means 5 along the trough wall 5w is captured on the L-shaped inner wall which is formed by the peripheral wall 1w and the ring shoulder 1r and drips from there into the fluid collection tank 21 or runs along the peripheral wall 2w into the fluid collection tank 21.

The ring shoulder 1r forms an opening 20 by which the immersion means 19 can be moved to the receiving means 5. The top part 1 is made as a separate component since the opening 20 has an opening diameter which is smaller than the diameter of the receiving means on the ring segment 5a.

REFERENCE NUMBER LIST

1 top part
1w peripheral wall
1r ring shoulder
2 bottom part
2w peripheral wall
2r ring shoulder
2e bearing ring
2u bottom
3 bearing
3k balls
4 hollow body
5 receiving means
5r peripheral edge
5o top edge
5a ring segment
5b trough bottom
5e immersion opening
5w trough wall
6 drain
8 fluid
9 substrate
9o substrate treatment surface
9a receiving surface
9s flushing surface
11 flushing means
1k flushing fluid channel
12 stator
12f guide segment
13 rotation means
13f guide segment
13s end side
14 drive means
15 heating space
16 heating means
17 heating plate
18 heating body
19 immersion means
19e immersion side
19r body of revolution
19s webs
19f flushing fluid line
20 opening
21 fluid collection tank
21a sunken region
21b bottom
22 fixing means
23 bearing cover
23o top
D axis of rotation
W trough wall angle Having described the invention, the following is claimed:

1. A device to treat a substrate treatment surface of a substrate with a fluid when the substrate treatment surface is immersed into the fluid, said device being comprised of:
receiving means comprising an immersion area configured to receive the fluid into which the substrate treatment surface is immersed during treatment thereof;
a chuck to which a receiving surface of the substrate is fixed during said treatment, the receiving surface facing away from the substrate treatment surface;
a first hollow body on which the receiving means is fixed to rotate therewith;
a drive motor configured to rotate the first hollow body to effect discharge of the fluid from the receiving means and empty the fluid out of the receiving means;
heating means positioned underneath the receiving means in a heating area defined by the receiving means and the first hollow body, the heating means comprising a heating body and a heating plate held in the heating area by the heating body, the heating plate being configured to heat the fluid in the immersion area; and
flushing means disposed between the first hollow body and the chuck, the flushing means being configured to flush a flushing fluid along a flushing surface of the substrate, the flushing surface being provided outside the substrate treatment surface and outside the receiving surface, the flushing surface extending annularly around the receiving surface.

2. The device as claimed in claim 1, wherein the immersion area is defined by a rotationally symmetrical trough, with one trough wall being angled in a radial direction.

3. The device as claimed in claim 2, further comprising:
a ring-shaped fluid collection tank configured to receive the discharged fluid from the receiving means,
wherein the receiving means has a peripheral edge that is curved away from the trough wall and projects over the first hollow body.

4. The device as claimed in claim 3, wherein a lowest point of the fluid collection tank is defined by a stator, and wherein the fluid collection tank has at least one drain comprising a triggerable valve.

5. The device as claimed in claim 1 or 2, wherein the receiving means is fixed on the first hollow body at a region of the peripheral edge of the receiving means, and
wherein the first hollow body is rotationally symmetrical.

6. The device as claimed in claim 5, further comprising:
a stator defined by a second rotationally symmetrical hollow body, the stator being configured to hold the first rotationally symmetrical hollow body rotatably therein.

7. The device as claimed in claim 6, wherein an inner periphery of the stator defines a first ring-shaped guide segment,
wherein the first rotationally symmetrical hollow body defines a second ring-shaped guide segment corresponding with the first ring-shaped guide segment,
wherein a ball bearing is positioned between the guide segments, and
wherein the ball bearing is configured to enable the first rotationally symmetrically hollow body to rotate along the first ring-shaped guide segment.

8. The device as claimed in claim 1, wherein the heating means is configured to rotate the heating body during the treatment of the substrate treatment surface.

9. The device as claimed in claim 1, wherein the flushing surface of the substrate is opposite the substrate treatment surface.

10. The device as claimed in claim 1, wherein the flushing surface of the substrate and the receiving surface of the substrate are on the same plane.

11. The device as claimed in claim 1, wherein the flushing surface of the substrate is not exposed to the fluid into which the substrate treatment surface is immersed.

12. A method for treatment of a substrate treatment surface of a substrate with a fluid when the substrate treatment surface is immersed in the fluid, the method comprising:

receiving the fluid in an immersion area of a receiving means into which the substrate treatment surface is to be immersed during treatment thereof;

fixing a receiving surface of the substrate that faces away from the substrate treatment surface to a chuck;

fixing the receiving means to a first hollow body to rotate therewith;

immersing the substrate treatment surface into the fluid for treatment therein;

flushing a flushing fluid along a flushing surface of the substrate using a flushing means disposed between the first hollow body and the chuck, the flushing surface being provided outside the substrate treatment surface and outside the receiving surface, the flushing surface extending annularly around the receiving surface;

heating the fluid in the immersion area during the treatment of the substrate treatment surface immersed in the fluid, the heating comprising activating heating means positioned underneath the receiving means in a heating area defined by the receiving means and the first hollow body;

withdrawing the substrate treatment surface from the fluid after the treatment thereof; and discharging the fluid from the receiving means by rotating the first hollow body to empty the fluid out of the receiving means.

13. The method as claimed in claim 12, wherein the first hollow body is rotated in a stator, wherein an inner periphery of the stator defines a first ring-shaped guide segment, wherein the first hollow body defines a second ring-shaped guide segment corresponding with the first ring-shaped guide segment, wherein a ball bearing is positioned between the guide segments, and wherein the ball bearing is configured to enable the first hollow body to rotate along the first ring-shaped guide segment.

14. The method as claimed in claim 12 or 13, wherein the heating further comprises controlling a temperature of the fluid during the immersing of the substrate treatment surface.

15. The method as claimed in claim 12 or 13, wherein the substrate treatment surface is rotated by the chuck at least during the immersing.

\* \* \* \* \*